United States Patent [19]

Kliman

[11] Patent Number: 5,477,163
[45] Date of Patent: Dec. 19, 1995

[54] TURN FAULT DETECTION

[75] Inventor: Gerald B. Kliman, Schenectady, N.Y.

[73] Assignee: General Electric Company, Schenectady, N.Y.

[21] Appl. No.: 285,469

[22] Filed: Aug. 3, 1994

[51] Int. Cl.$^6$ .................................................. G01R 31/34
[52] U.S. Cl. ........................................... 324/772; 318/434
[58] Field of Search ................................... 318/434, 433, 318/432; 324/772

[56] References Cited

U.S. PATENT DOCUMENTS

| | | | |
|---|---|---|---|
| 4,585,985 | 4/1986 | Bose | 318/803 |
| 5,270,640 | 12/1993 | Kohler et al. | 324/772 |
| 5,345,158 | 9/1994 | Kliman et al. | 318/434 |

OTHER PUBLICATIONS

"Analysis of Electric Machinery", by Paul C. Krause, p. 178, Sec. 4.6, 1986.
"An On–Line Method To Detect Incipient Failure Of Turn Insulation In Random—Wound Motors", Joseph Sotille, Jr, et al, pp. 1–7, 1993.

Primary Examiner—Kenneth A. Wieder
Assistant Examiner—Barry C. Bowser
Attorney, Agent, or Firm—Ann M. Kratz; Marvin Snyder

[57] ABSTRACT

A method for detecting turn faults in an induction motor comprises measuring at least two motor phase currents, at least two motor phase voltages, and the negative sequence impedance. Motor torque is estimated by employing the at least two motor phase currents and the at least two motor phase voltages. Motor pu slip is estimated by employing the motor torque. The motor pu slip is used to estimate the load variation effect on the negative sequence impedance. The negative sequence impedance is adjusted in accordance with the load variation effect, and it is determined whether the adjusted negative sequence impedance value indicates the presence of a turn fault.

20 Claims, 4 Drawing Sheets

TURN FAULT DETECTION

BACKGROUND OF THE INVENTION

1. Field of the Invention

This invention relates generally to motors and, more particularly, to detection of turn faults in induction motors using estimation of negative sequence impedance trends.

2. Description of the Related Art

A promising technique for induction motor turn fault detection requires measurement of the variation of negative sequence impedance. For example, Joseph Sottile Jr. and Jeffery L. Kohler, in a paper presented at the IEEE/PES Winter 1993 Meeting entitled "An On-Line Method to Detect Incipient Failure of Turn Insulation in Random-Wound Motors," describe a process in which it is feasible to detect turn faults passively on line by trending the negative sequence impedance. Although negative sequence impedance varies with load, the discussion in Kohler et al. assumes that load variation effects are negligible.

In many motors sudden load changes can cause negative impedance variations large enough to interfere with turn fault detections because variations in the range of 0.1% to 1.0% (typically about 0.5%) are sought to indicate fault conditions.

In most motors, although an insulation fault can require a significant period of time to develop, measurable negative sequence impedance effects are not detectable until a turn develops an actual short circuit. Avalanching of a slowly developing insulation weakness can occur in a very short time after a long period of leakage of currents and result in an abrupt change in the negative sequence impedance. Load effects can interfere with turn fault detection measurements and thereby sometimes prevent detection of faults or create false alarms.

SUMMARY OF THE INVENTION

Accordingly, one object of the present invention is to provide a more sensitive and reliable negative sequence impedance turn fault detection method by removing load variation from the negative sequence impedance. This object is achieved by estimating the per unit (pu) slip via a torque calculation in an induction motor to compensate for the load variation of negative sequence impedance in turn fault detectors.

Briefly, in accordance with a preferred embodiment of the invention, a method for detecting turn faults in an induction motor comprises measuring at least two motor phase currents and at least two motor phase voltages, and using the measured currents and voltages to obtain the negative sequence impedance. Motor torque is estimated by employing the at least two motor phase currents and the at least two motor phase voltages. Motor pu slip is estimated by using the motor torque. The load variation effect on the negative sequence impedance is estimated by employing the motor pu slip. The negative sequence impedance is adjusted in accordance with the load variation effect, and it is determined whether the adjusted negative sequence impedance value indicates the presence of a turn fault.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
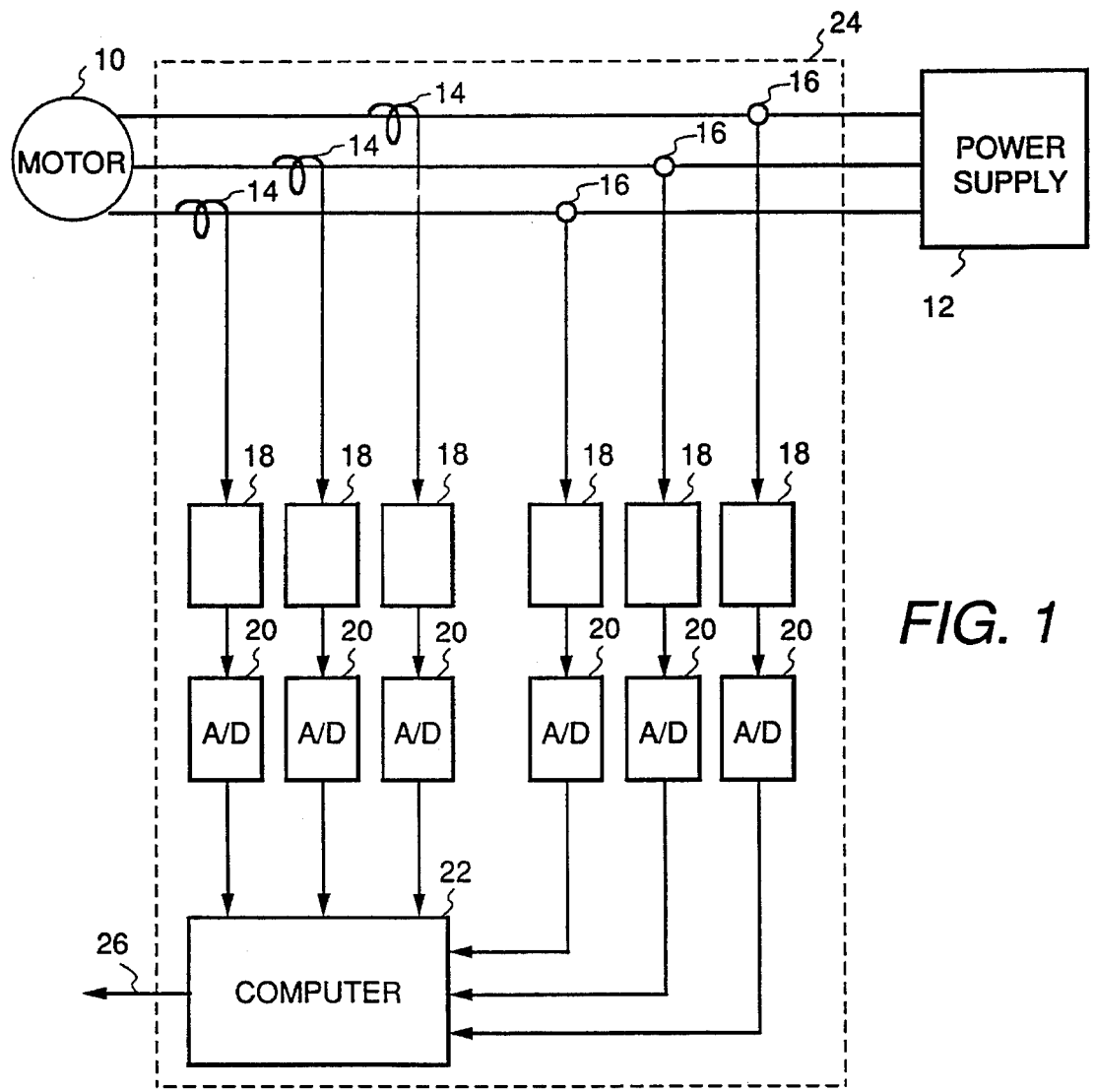
FIG. 1 is a block diagram of a data acquisition system for detecting turn faults.

FIG. 1 is a block diagram of a data acquisition system for detecting turn faults in an induction motor 10 receiving power from a power supply 12. Three current sensors 14 measure motor phase current, and three voltage sensors 16 measure motor phase voltage. In one embodiment, the current sensors comprise current transformers and the voltage sensors comprise voltage transformers. Other standard forms of current and/or voltage sensors can be used, if desired. For example, commonly assigned G. B. Kliman et al., "Electrical Distribution Equipment with Torque Estimating Capability," Application Serial No. 07/955,808, filed Oct. 2, 1992 and allowed Apr. 8, 1994, describes techniques such as using series resistances in the wires, voltage dividers, and/or sensors of Hall effects. Although three phase currents and three phase voltages are shown, only two phase current measurements and phase voltage measurements are actually required because the third phase current and phase voltage can then each be calculated using Kirchoff's laws. Furthermore, although a three-phase motor is shown, this invention is also applicable to two-phase motors and to motors having more than three phases.

Each measurement of a phase current or phase voltage is processed by a respective signal conditioner 18. In one embodiment the signal conditioner includes an amplifier and an anti-aliasing filter which acts as a low-pass filter to remove components greater than one half of the sampling frequency, so that such components do not fold over and interfere with the low-pass measurement.

After the signal conditioning, each conditioned signal can be converted to a digital signal by an analog-to-digital (A/D) converter 20. There can be an individual A/D converter for each individual signal conditioner, as shown, or there can be a single A/D converter with a switch used to convert each of the six signals.

The phase voltages and phase currents that are measured can be processed in the computer by being separated into balanced but oppositely rotating sets according to the theory of symmetrical components by using the following equations:

$$I_o = (1/3)*(I_A + I_B + I_C)$$

$$I_+ = (1/3) \cdot (I_A + aI_B + A^2 I_C)$$

$$I_- = (1/3) * (I_A + a^2 I_B + aI_C)$$

wherein $I_A$, $I_B$, and $I_C$ represent current phasors obtained from the measured phase currents and "a" represents the phase shift $e^{j2\pi/3}$. $1_+$ is the "positive" or "normal" sequence current that creates the desired torque. $1_-$, the "negative" or "reverse rotation" sequence current that reduces torque, is not present if the motor is symmetrical and the excitation is symmetrical. If the negative sequence current is present in significant amounts, the negative sequence current will produce a drag and corresponding losses. $I_o$ is a non-rotating "zero" sequence current which is zero if there is no neutral connection (as is the typical situation). If the motor becomes asymmetrical because, for example, there is a turn-to-turn fault in one phase, a negative sequence current will appear. Thus the negative sequence current has the potential of being a sensitive indicator of unbalance. Corresponding calculations can also be performed with the phase voltages.

Because the phase voltage is usually unbalanced to some degree, measuring the negative sequence current or voltage alone is insufficient. The effects of the negative sequence voltage unbalances can be compensated by examining the negative sequence impedance, which is a function of only the motor.

Figure 2:
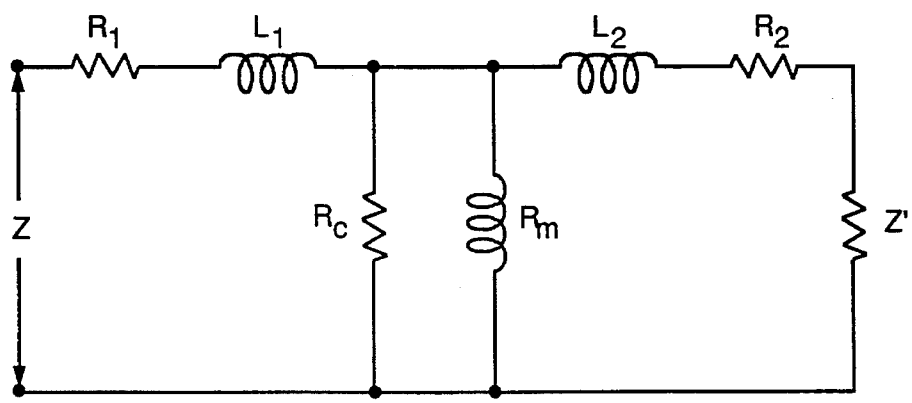
FIG. 2 is a circuit diagram of a per phase equivalent circuit for a balanced motor.

FIG. 2 is a circuit diagram of a per phase equivalent circuit for an unfaulted motor with balanced excitation, wherein $R_1$ and $R_2$ represent the stator and rotor resistances, respectively, $L_1$ and $L_2$ represent the stator and rotor inductances, respectively, $R_c$ represents the core losses, $L_m$ represents the magnetizing inductances, $Z'$ represents the variable component of the rotor resistance and Z represents the resulting net negative sequence impedance at the motor terminals. The negative sequence impedance, which refers to a symmetrical set, can be obtained from the same per phase equivalent circuit, except for the magnitudes of the skin effected component $R_C$ and the saturation of $L_m$. This analysis assumes a balanced (unfaulted) motor. The pu slip is not zero because the rotor must turn slightly slower than the magnetic field of the stator in order to develop sufficient torque. The fields due to negative sequence components revolve backward with respect to the rotation of the mechanical rotor. The variable portion of the circuit for positive sequences (assuming constant temperature) is the impedance $Z'_+$. At constant voltage $L_m$ and R2 will not vary measurably over the normal load range. The positive sequence impedance $Z'_+$ can be estimated as follows:

$$Z'_+ = R_2(1-S)/S$$

wherein "s" is the appropriate per unit (pu) slip (the difference between the synchronous speed and the mechanical speed divided by the synchronous speed). Rewriting this equation for the negative sequence impedance due to an impedance $Z'_-$ in terms of the normal forward sequence pu slip results in the following expression:

$$Z'_- = -R_2(1-S)/(2-S)$$

Thus, the negative sequence impedance will vary, not only as a result of an unbalance or fault in the motor, but also with the load because the mechanical speed, and hence the pu slip, varies with the load. In prior techniques, this variation has been dismissed as "small." In some applications the effect being sought for a single turn fault in a medium sized motor is in the range of 0.1% to 1.0%, however, and the variation due to load can exceed this range.

Figure 3:
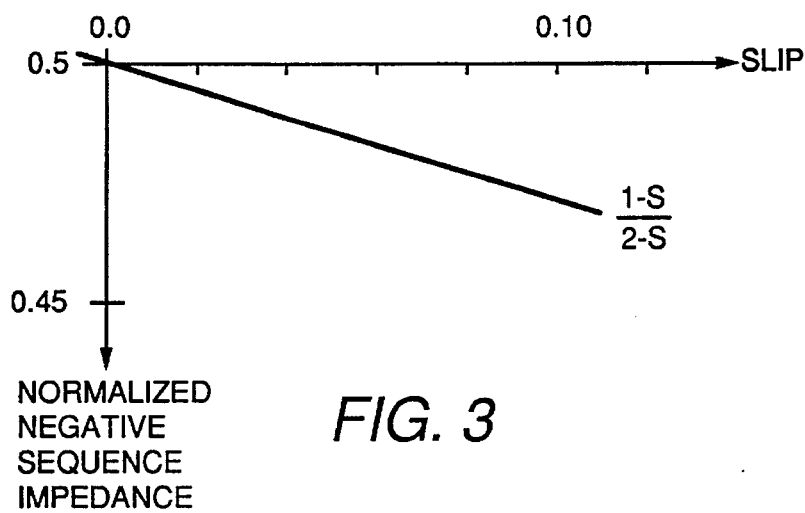
FIG. 3 is a graph illustrating the relation between pu slip and negative sequence impedance.

FIG. 3 is a graph illustrating the relation between pu slip and the normalized negative sequence impedance $Z'_-/R_2$. A 5% variation is possible and a 2% variation is usual when the load varies from low to high. This range of load variations is a problem when attempting to trend variations approximately at or below 1%.

Thus, the negative sequence impedance should be adjusted for the variation in pu slip. When the equivalent circuit parameters of FIG. 2 are known, they can be used in conjunction with the pu slip when the pu slip is known. If the equivalent-circuit parameters are not available, typical parameter handbook values corresponding to the machine size and poles can be used. In either situation, the pu slip, i.e. mechanical speed, must be obtainable. The mechanical speed of industrial motors, however, is usually not monitored.

Figure 4:
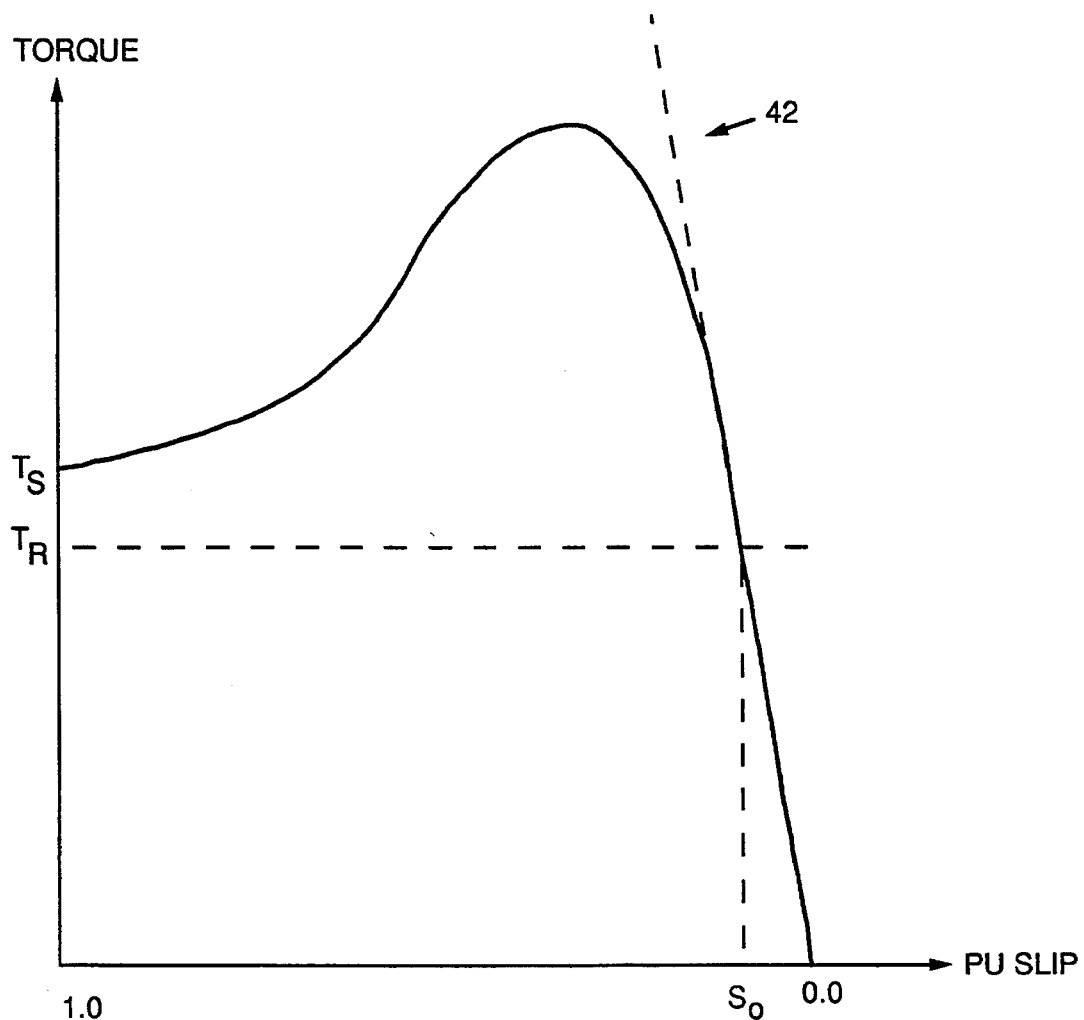
FIG. 4 is a graph illustrating the relation between torque and pu slip.

Current and power are often used for estimating the load of a motor, but these variables are frequently in error at low and high loads. However, the torque can be calculated using current and voltage values as described in Aforementioned G. B. Kliman et al., application Ser. No. 07/955,808, which is herein incorporated by reference, and in Paul C. Krause, *Analysis of Electric Machinery*, section 4.6, McGraw-Hill Book Company (1986). The torque of an induction motor is almost a linear function of the pu slip over the range between light loads and modest overloads. Therefore, once the torque is known, the pu slip can be closely estimated by using the nameplate data which lists the rated load and the synchronous speed. For example, FIG. 4 is a graph illustrating the relation between torque and pu slip for a typical motor with arrow 42 indicating an approximately straight line along $T = T_R(S/S_o)$, with T representing torque, $T_R$ representing rated torque, s representing pu slip, $s_o$ representing rated slip, and $T_S$ representing starting torque. The approximation begins to deviate from the linear shape when the torque exceeds about 1.5 $T_R$ in the motor's normal operating range.

After the pu slip has been estimated, the magnitude of the variation of net negative sequence impedance can be estimated by determining the negative sequence impedance due to $Z'_-$ and working back through the circuit in a conventional manner.

If the equivalent circuit parameters are known, the calculation will be quite accurate, and if the equivalent values are unknown, typical values can be used. In situations where both equivalent and typical values for the particular type of motor are not available, correction values can be measured by varying the load, and these values can be placed in a correction table. Alternatively, if the parameters are not known, the stator resistance $R_1$ can be measured, and, in typical motor designs, the rotor resistance $R_2$ (referred to the stator) is roughly the same value as the stator resistance. The values of $R_1$ and $R_2$ are useful because the variation of the real part of the impedance can be estimated by itself. The real part of the net negative sequence impedance ($R_1 + R_2 + R_2 * (1-s)/(2-s)$) is a more sensitive measurement than the imaginary part of the negative sequence impedance ($j\omega*(L_1+L_2)$) which is quite constant.

Figure 5:
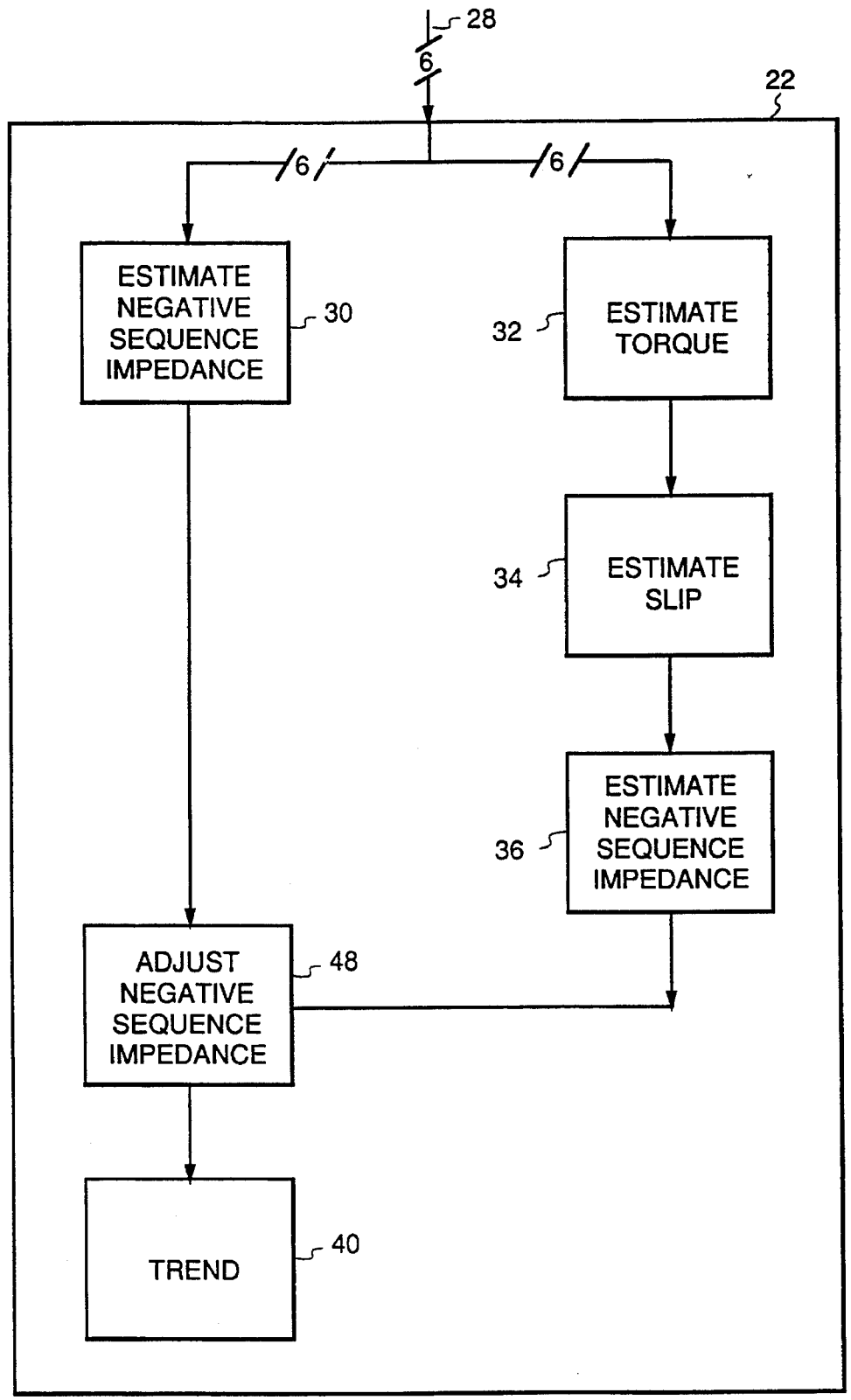
FIG. 5 is a flowchart of a procedure for detecting turn faults by estimating variations in the negative sequence impedance due to load variations.

FIG. 5 is a flowchart of a procedure for detecting turn faults by estimating variations in the negative sequence impedance due to load variations. Each of three input phase current and three input phase voltage signals 28 from A/D converters 20 is input into computer 22. It is, preferable, but not necessary for this invention that digital signals be used. At step 30, negative sequence impedance is measured by dividing the negative sequence voltage by the negative sequence current. The negative sequence impedance current and voltage values can be obtained from the measured phase current and voltage values, respectively, as discussed above.

At step 32 signals 28 are used to estimate the motor torque using the process discussed above with respect to FIG. 4.

After the motor torque is estimated, the pu slip can be estimated at step 34, for example, by use of equations or an appropriate graph such as shown in FIG. 4. The estimated pu slip is then-used at step 36 to estimate the net negative sequence impedance for a balanced motor with the above-discussed technique.

Then at step 38 the negative sequence impedance variation due to load variations is compensated by removing that amount of negative sequence impedance variation which is caused by the load variation that was estimated at step 36. An estimation can be made of the net negative sequence impedance which would occur if the slip were zero. If the estimation of negative sequence impedance for the zero slip calculation is subtracted from the estimated negative sequence impedance for the pu slip calculation, then the result is the variation of negative sequence impedance due to load. This variation can be subtracted from the measured negative sequence impedance to provide a compensated, adjusted negative sequence impedance value.

The adjusted negative sequence impedance variation is then used to chart the negative sequence impedance trend at step 40.

For example, the parameters of the circuit shown in FIG. 2 for one 30 horse-power, 4 pole, 120 volt, 60 Hz motor are:

$R_1=0.05$ ohm
$R_2=0.07$ ohm
$R_C=26$ ohm
$X_1$ $(2\pi f L_1)=0.13$ ohm
$X_2=0.13$ ohm
$X_m=7$ ohm.

For an approximate calculation, the parameters are assumed to be the same for both the positive and negative sequence impedance calculations. For a more precise estimation, $R_C$ should be modified because, due to skin effect as discussed earlier, $R_C$ has a higher value in the negative sequence impedance calculation. The impedance of $X_m$ will vary with voltage but will be substantially the same for positive and negative sequences.

The variable resistor will have a magnitude of about 0.04 ohm at nominal pu slips, so, for simplicity the shunt elements (RC and Xm) can be safely neglected. The negative sequence impedance for the balanced motor can then be approximately estimated as:

$$Zn=R1+R2+j(X1+X2)+Z'_r,$$

or, $Zn=0.12+j0.26-0.07(1-S)/2-S)$

The magnitude of $Z_n$ will then vary about 0.2% as pu slip varies from zero to 0.1 over the maximum load range. The real part of the measured negative sequence impedance can then be corrected with the pu slip and reformed. As discussed above, alternatively, the variation of the real part of the impedance can be estimated by itself.

Figure 6A:
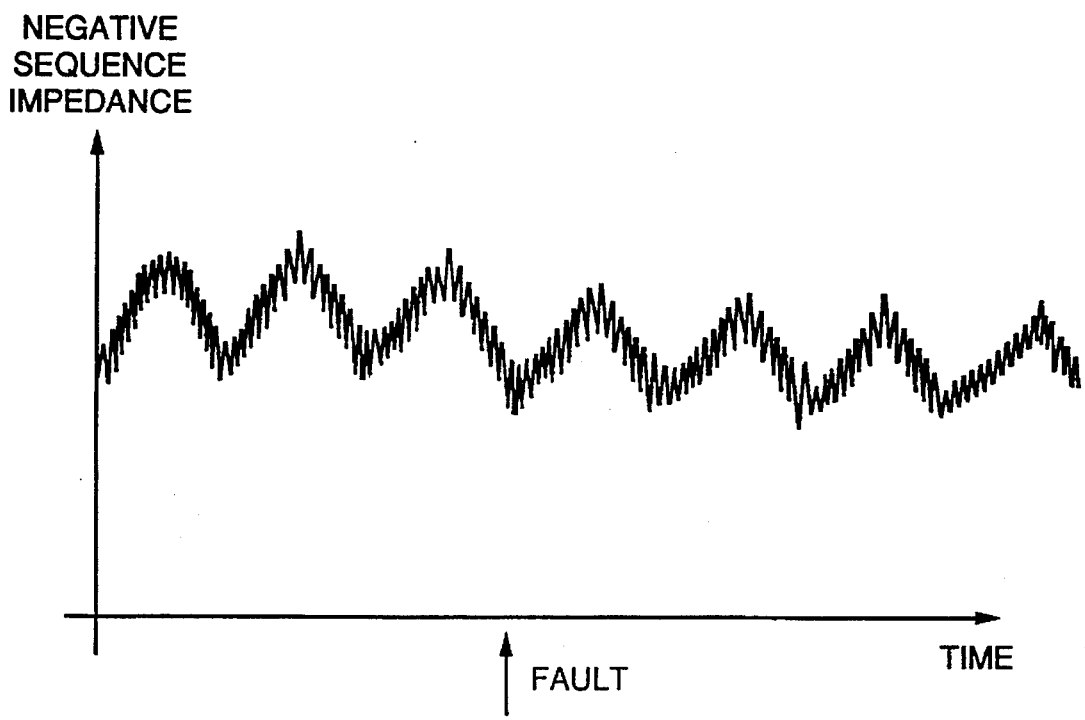
FIG. 6(a) is a graph of an expected negative sequence impedance trend which might occur without compensation.

The trend of negative sequence impedances is expected to appear as depicted in FIG. 6(a), which is a graph of an expected negative sequence impedance trend over time which might occur without compensation if the load is cyclically varying. The magnitude of the negative sequence impedance is expected to vary as the load changes on a relatively short time scale. There will additionally be longer term trends due to motor heating. As discussed earlier, small load variations of 0.1% to 0.2% are large enough to cloud the trend when looking for 0.5% variations to indicate a turn fault.

Figure 6B:
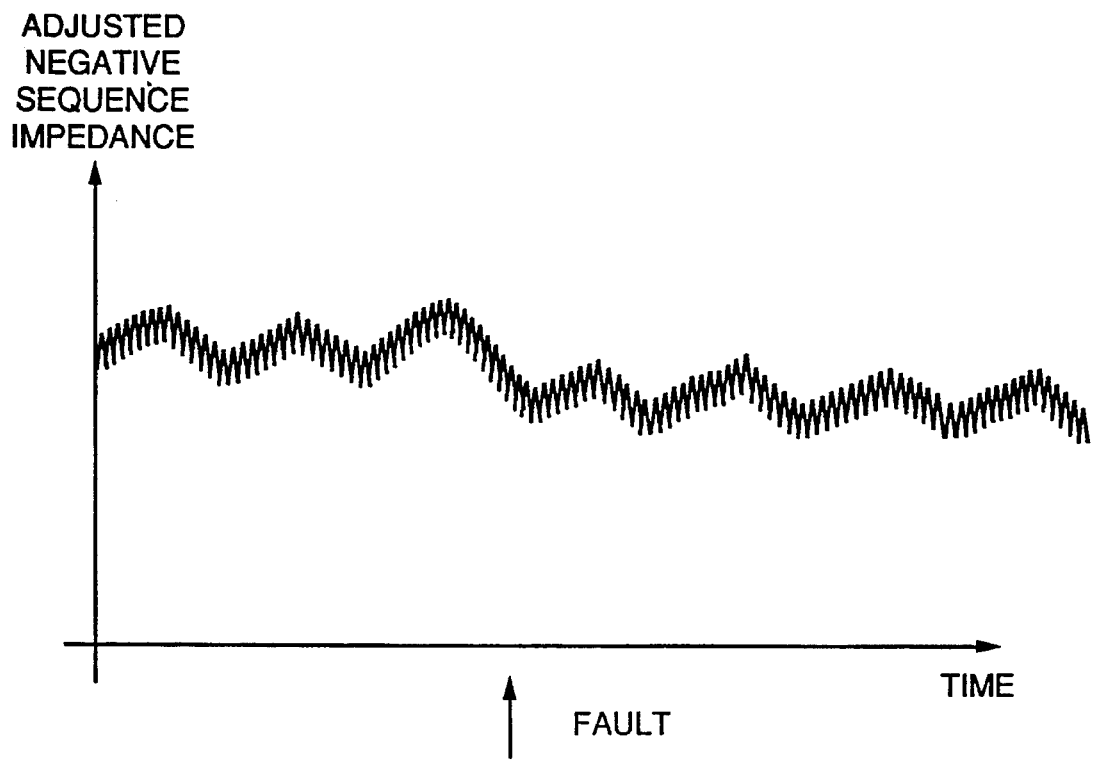
FIG. 6(b) is a graph of an expected negative sequence impedance trend which might occur with compensation.

FIG. 6(b) is a graph of an expected adjusted negative sequence impedance trend over time which might result under the conditions of the same cyclically varying load discussed with respect to the graph of FIG. 6(a) with compensation. Although some mild fluctuations in negative sequence impedance are still expected to occur because of noise and imperfect knowledge of the parameters, the compensation system is expected to reduce the short and long term negative sequence impedance variations so as to cause faults to be more visible. A fault occurs when the adjusted negative sequence impedance either falls outside a predetermined acceptable range or when the most recently adjusted negative sequence impedance differs from the immediately prior adjusted negative sequence impedance by a selected amount. When a fault occurs, a system can be designed to either trigger an alarm or disconnect the motor.

While only certain preferred features of the invention have been illustrated and described herein, many modifications and changes will occur to those skilled in the art. It is, therefore, to be understood that the appended claims are intended to cover all such modifications and changes as fall Within the true spirit of the invention.

What is claimed is:

1. A method for detecting turn faults in an induction motor comprising the steps of:

measuring at least two motor phase currents;

measuring at least two motor phase voltages;

employing the at least two motor phase currents and the at least two motor phase voltages to estimate the negative sequence impedance;

employing the at least two motor phase currents and the at least two motor phase voltages to estimate motor torque;

employing the motor torque to estimate motor pu slip;

employing the motor pu slip to estimate load variation effect on the negative sequence impedance;

adjusting the negative sequence impedance in accordance with the load variation effect; and determining whether the adjusted negative sequence impedance value indicates the presence of a turn fault.

2. The method of claim 1, further including the step of disconnecting the motor if the adjusted negative sequence impedance value indicates the presence of a turn fault.

3. The method of claim 1, further including the step of triggering an alarm of the motor if the adjusted negative sequence impedance value indicates the presence of a turn fault.

4. The method of claim 1, wherein the steps of employing the motor pu slip to estimate the load variation effect and adjusting the negative sequence impedance comprise estimating the amount of negative sequence impedance attributable to the motor load, and subtracting the attributable amount of negative sequence impedance from the estimated negative sequence impedance.

5. The method of claim 4, wherein the step of employing the motor pu slip to estimate load variation effect on the negative sequence impedance comprises estimating a first adjusted value of negative sequence impedance using the estimated pu slip, estimating a second adjusted value of negative sequence impedance using a value of zero for slip, and subtracting the second adjusted value of negative sequence impedance from the first adjusted value of negative sequence impedance.

6. The method of claim 1, wherein the step of employing the at least two motor phase currents and the at least two motor phase voltages to estimate the negative sequence impedance comprises employing the at least two motor phase voltages to obtain the negative sequence impedance voltage, employing the at least two motor phase currents to obtain the negative sequence impedance current; and dividing the negative sequence impedance voltage by the negative sequence impedance current.

7. The method of claim 1, wherein the step of employing the motor torque to estimate the pu slip comprises obtaining information about the pu slip from a graph of the relation between torque and pu slip.

8. The method of claim 1, wherein the motor comprises a three phase motor.

9. The method of claim 1, wherein the step of determining whether the adjusted negative sequence impedance value indicates the presence of a turn fault comprises determining whether the adjusted negative sequence impedance value is outside of a predetermined range of acceptable values.

10. The method of claim 1, wherein the step of determining whether the adjusted negative sequence impedance value indicates the presence of a turn fault comprises determining whether the adjusted negative sequence impedance value differs from an earlier adjusted negative sequence impedance value estimated immediately prior to the adjusted negative sequence impedance value by a selected amount.

11. The method of claim 1, further including, prior to employing the at least two motor phase currents and the at least two motor phase voltages to estimate the motor torque, the step of converting the at least two motor phase currents and the at least two motor phase voltages into digital signals.

12. A method for detecting turn faults in a three-phase motor comprising the steps of:

measuring at least two motor phase currents;

converting the at least two motor phase currents into three digital phase current signals;

measuring at least two motor phase voltages;

converting the at least two motor phase voltages into three digital phase voltage signals;

employing the three digital phase current signals and the three digital phase voltage signals to estimate the negative sequence impedance;

employing the three digital phase current signals and the three digital phase voltage signals to estimate motor torque;

employing the motor torque to estimate motor pu slip;

employing the pu slip to estimate the amount of negative sequence impedance attributable to the motor load;

subtracting the attributable amount of negative sequence impedance from the estimated negative sequence impedance to obtain an adjusted negative sequence impedance in accordance with the load variation effect; and determining whether the adjusted negative sequence impedance value indicates the presence of a turn fault.

13. The method of claim 12, wherein the step of employing the motor pu slip to estimate the load variation effect on the negative sequence impedance comprises estimating a first adjusted value of negative sequence impedance using the estimated pu slip, estimating a second adjusted value of negative sequence impedance using a value of zero for slip, and subtracting the second adjusted value of negative sequence impedance from the first value of negative sequence impedance.

14. The method of claim 13, wherein the step of employing the motor torque to estimate the pu slip comprises obtaining information about the pu slip from a graph of the relation between torque and pu slip.

15. An apparatus for detecting turn faults in an induction motor comprising:

at least two current sensors for measuring at least two motor phase currents;

at least two voltage sensors for measuring at least two motor phase voltages;

means for employing the at least two motor phase currents and the at least two motor phase voltages to estimate the negative sequence impedance;

means for employing the at least two motor phase currents and the at least two motor phase voltages to estimate motor torque;

means for employing the motor torque to estimate motor pu slip;

means for employing the motor pu slip to estimate load variation effect on the negative sequence impedance;

means for adjusting the negative sequence impedance in accordance with the load variation effect; and means for determining whether the adjusted negative sequence impedance value indicates the presence of a turn fault.

16. The apparatus of claim 15, wherein the means for employing the motor torque to estimate motor pu slip comprises means for obtaining information about the pu slip using the approximately linear relation between torque and pu slip.

17. The apparatus of claim 15, wherein the means for determining whether the adjusted negative sequence impedance indicates the presence of a turn fault comprises means for obtaining a trend of consecutive adjusted negative sequence impedances and indicating the presence of a fault when one adjusted negative sequence impedance differs from a previous adjusted negative sequence impedance by a selected amount.

18. The apparatus of claim 15, wherein the means for determining whether the adjusted negative sequence impedance indicates the presence of a turn fault comprises means for obtaining a trend of consecutive adjusted negative sequence impedances and indicating the presence of a fault when the adjusted negative sequence impedance is outside of a predetermined range of acceptable values.

19. The apparatus of claim 15, further including means for disconnecting the motor if the adjusted negative sequence impedance value indicates the presence of a turn fault.

20. The apparatus of claim 15, further including means for triggering an alarm of the motor if the adjusted negative sequence impedance value indicates the presence of a turn fault.

* * * * *